United States Patent [19]
Koh

[11] Patent Number: 5,545,586
[45] Date of Patent: Aug. 13, 1996

[54] METHOD OF MAKING A TRANSISTOR HAVING EASILY CONTROLLABLE IMPURITY PROFILE

[75] Inventor: Risho Koh, Tokyo, Japan

[73] Assignee: NEC Corporation, Japan

[21] Appl. No.: 242,147

[22] Filed: May 13, 1994

Related U.S. Application Data

[62] Division of Ser. No. 800,581, Nov. 27, 1991, abandoned.

[30] Foreign Application Priority Data

Nov. 27, 1990 [JP] Japan .................................... 2-324799

[51] Int. Cl.⁶ .................................................. H01L 21/20
[52] U.S. Cl. ............................ 437/89; 437/40; 437/913; 437/180
[58] Field of Search ........................ 257/330, 334; 437/40, 52, 89, 60, 90, 915, 913, 180

[56] References Cited

U.S. PATENT DOCUMENTS

| | | | |
|---|---|---|---|
| 4,334,235 | 6/1982 | Nishizawa | 257/331 |
| 4,663,831 | 5/1987 | Birittella et al. | 148/DIG. 50 |
| 4,757,029 | 7/1988 | Koury, Jr. | 437/90 |
| 4,764,801 | 8/1988 | McLaughlin et al. | 357/59 |
| 4,786,615 | 11/1988 | Liaw et al. | 437/90 |
| 4,860,077 | 8/1989 | Reuss et al. | 357/34 |
| 4,902,641 | 2/1990 | Koury, Jr. | 437/915 |
| 4,994,999 | 2/1991 | Nishizawa | 257/264 |
| 5,208,172 | 5/1993 | Fitch et al. | 437/89 |
| 5,308,778 | 5/1994 | Fitch et al. | 437/915 |
| 5,340,754 | 8/1994 | Witek et al. | 437/51 |

OTHER PUBLICATIONS

"A Surrounding Gate Transistor (SGT) Cell for 64/256 Mbit DRAMs", K. Sunouchi, et al., ULSI Research Center, Toshiba Corporation, IEDM, 1989, pp. 23–26.

"A Fully Depleted Lean–Channel Transistor (DELTA)", D. Hisamoto, et al. Central Research Laboratory, Hitachi, Ltd. IEDM, 1989, pp. 833–836.

Primary Examiner—George Fourson
Assistant Examiner—S. Mulpuri
Attorney, Agent, or Firm—Laff, Whitesel, Conte & Saret, Ltd.

[57] ABSTRACT

On the substrate of an integrated circuit chip is deposited a first insulating layer in which a low resistivity semiconductor region is subsequently formed. An insulating film is formed on a side wall of the low resistivity semiconductor region. A slit is formed in the first insulating layer so that a portion of the substrate and a portion of the insulating film are exposed. First, second and third semiconductor layers of different conductivity types are epitaxially grown in the slit so that the second layer is in contact with the exposed insulating film. A second insulating layer is deposited on the chip. Through the second insulating layer first, second and third electrodes are brought into contact with the first and third semiconductor layers and with the low resistivity semiconductor region. Due to the stacking of epitaxial layers of different conductivity types, the impurity profiles of the epitaxial layers can be precisely controlled.

4 Claims, 14 Drawing Sheets

METHOD OF MAKING A TRANSISTOR HAVING EASILY CONTROLLABLE IMPURITY PROFILE

This application is a division of application Ser. No. 07/800,581, filed Nov. 27, 1991, is not abandoned.

BACKGROUND OF THE INVENTION

The present invention relates to an integrated circuit transistor and a method for making it A three-dimensional MOS transistor of a pillar-like structure is shown and described in a paper titled 'A Surrounding Gate Transistor (SGT) Cell for 64/256 Mbit DRAMs', K. Sunouchi et al, IEDM Technical Digest 1989, pages 23 to 26. According to this structure, the drain region is formed on top of the transistor and the channel region is located below the drain region. In the lower part of the transistor is the source region. In one type of the structure, the source region extends sideways and in the other type it vertically extends in the form of side walls. According to another three-dimensional MOSFET as described in a paper titled 'A Fully Depleted Lean-Channel Transistor (DELTA)', D. Hisamoto et al, IEDM Technical Digest 1989, pages 833 to 836, the drain and source regions of the transistor are formed by a planar structure which is erected on a substrate and the center region of the planar structure is buried under an insulated gate.

One shortcoming of the prior art inherent in the Hisamoto's structure is that since impurities must be doped sideways of the source region high level of precision control is needed to achieve the required impurity profile. In addition, the prior art structures are still not satisfactory to achieve higher level of density.

SUMMARY OF THE INVENTION

It is therefore an object of the present invention to provide a high density transistor structure and a method for fabricating it.

According to a first aspect of the present invention, there is provided a method for fabricating a transistor on a semiconductor substrate. A first insulating layer is formed on the substrate and a low resistivity semiconductor region is formed in the first insulating layer. An insulating film is then formed on a sidewall of the low resistivity semiconductor region. A slit is formed in the first insulating layer adjacent to the insulating film so that a portion of the substrate and a portion of the insulating film are exposed to the outside. First, second and third layers of semiconductor are successively epitaxially grown in the slit so that the second layer is in contact with the exposed portion of the insulating film, the first and third layers having same conductivity type and the second layer having a conductivity type opposite to the conductivity type of the first and third layers. A second insulating layer is formed on the first insulating layer so that the third layer of semiconductor is buried under the second insulating layer. In the second insulating layer first, second and third contact holes are created so that a portion of the third semiconductor layer, a portion of the first semiconductor and a portion of the low resistivity semiconductor region are exposed to the outside. First, second and third metal contacts are developed in the first, second and third holes, respectively. Due to the stacking of epitaxial layers of different conductivity types, the impurity profiles of the epitaxial layers can be precisely controlled.

According to second aspect of this invention, the transistor is fabricated on a semiconductor substrate by forming a first low resistivity semiconductor region in the substrate. A first insulating layer is formed on the substrate so that it covers the first low resistivity semiconductor region. A slit is formed in the first insulating layer so that a portion of the first low resistivity semiconductor region is exposed to the outside through the slit. First, second and third epitaxial layers are successively grown in the slit so that the first epitaxial layer is in contact with the low resistivity region. A portion of the first insulating layer is removed so that the second and third epitaxial layers are exposed to the outside. An insulating film is then formed on a side wall of the second epitaxial layer and a second low resistivity region is brought into contact with the insulating film. A second insulating layer is deposited on the first insulating layer so that the exposed epitaxial layers, the insulating film and the second low resistivity region are buried under the second insulating layer. A first contact hole extends through the first and second insulating layers to a portion of the first low resistivity region, a second contact hole extending through the second insulating layer to a portion of the second low resistivity region, and a third contact hole extending through the second insulating layer to a portion of the third epitaxial layer.

According to a third aspect of the invention, a first insulating layer is formed on a substrate, and a semiconductive polycrystalline structure is created in the first insulating layer so that a portion of the polycrystalline structure is in contact with the substrate. The polycrystalline structure is heated so that it changes to a single crystalline structure using the substrate as a seed material.. A portion of the first insulating layer is then removed so that the single crystalline structure is exposed. A first conductivity type impurity is injected into the exposed single crystalline structure and an insulating film is formed on a center portion of the single crystalline structure. A low resistivity semiconductive layer is formed on the insulating film and a second conductivity type impurity is injected into first and second end portions of the single crystalline structure. A second insulating layer is formed on the first insulating layer so that the low resistivity layer and the single crystalline structure are buried under the second insulating layer. A portion of the low resistivity layer is exposed to the outside through a first contact hole, and the first and second end portions of the single crystalline structure are exposed through second and third contact holes, respectively.

According to a fourth aspect of the invention, a first insulating layer is formed on a substrate and a low resistivity region with an insulating film thereon is formed in the first insulating layer adjacent to a surface thereof remote from the substrate, and a seed of epitaxial growth is provided extending from the substrate to the surface. A chemically resolvable layer is formed on the first insulating layer so that it contacts with the insulating film and the seed. A second insulating layer is deposited so it fully covers the resolvable layer. The resolvable layer is then removed under a chemical reaction through a hole in the second insulating layer to leave a chamber. First, second third epitaxial regions are successively formed in the chamber so that the second expitaxial region is in contact with the insulating film. Through the second insulating layer a portion of the second epitaxial region is exposed through a first contact hole, a portion of the first epitaxial region is exposed through a second contact hole, and a portion of the third epitaxial region is exposed through a third contact hole.

According to another aspect of this invention, there is provided a transistor comprising a semiconductor substrate, a lower layer of elongated semiconductor body on the substrate, an intermediate layer of elongated semiconductor body on the lower layer, the intermediate semiconductor layer having a conductivity type opposite to the conductivity type of the lower layer, and an upper layer of elongated semiconductor body having the same conductivity type as the lower semiconductor layer on the intermediate layer. An insulating film is formed on one sidewall of the intermediate layer. A low resistivity semiconductor region is provided adjacent to the insulating film. A controlling electrode is coupled to the low resistivity semiconductor region. A first controlled electrode is coupled to the upper layer and a second controlled electrode has a vertical extension which is coupled to the lower semiconductor layer and insulated from the upper and intermediate layers. Due to the stacked layers of semiconductor of different conductivity types, the density of an integrated circuit chip can be significantly increased.

BRIEF DESCRIPTION OF THE DRAWINGS

The present invention will be described in further detail with reference to the accompanying drawings, in which:

FIGS. 1a through 1r illustrate steps of making an integrated circuit chip including two transistors according to one embodiment of the present invention, in which:

FIGS. 2a through 2l illustrate steps of making an integrated circuit transistor according to a second embodiment of the present invention, in which

FIGS. 3a through 3i illustrate steps of making an integrated circuit chip according to a third embodiment of the present invention, in which

FIGS. 5a through 5g illustrate steps of making an integrated circuit transistor according to a fourth embodiment of the present invention, in which

DETAILED DESCRIPTION

Figure 1A:
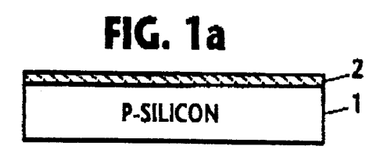
Figure 1B:
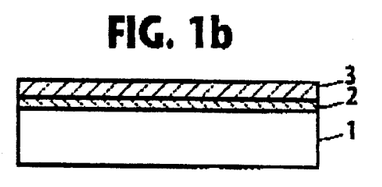
Figure 1C:
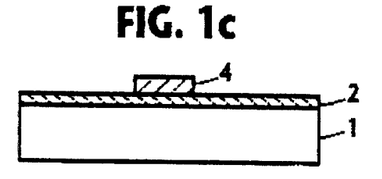
Figure 1D:
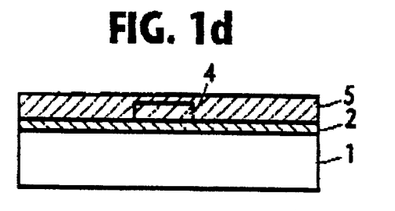
Figure 1E:
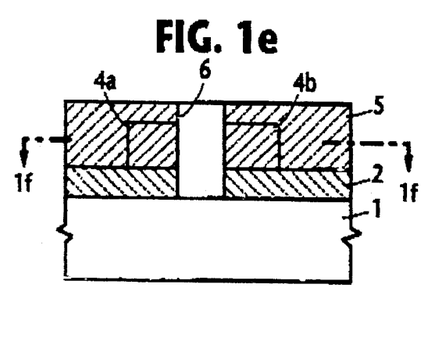
Figure 1F:
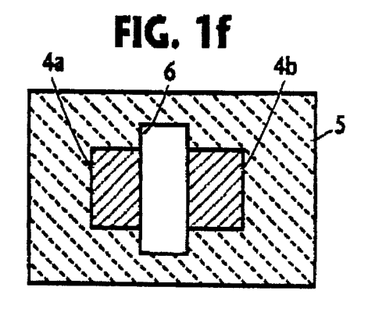
FIG. 1f is a cross-sectional view taken along the lines 1f—1f of FIG. 1e.
Figure 1G:
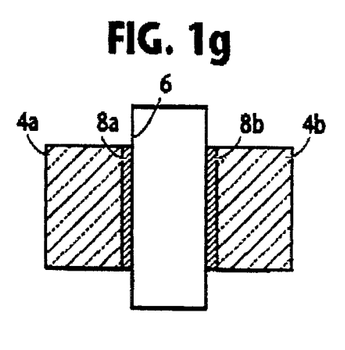
Figure 1H:
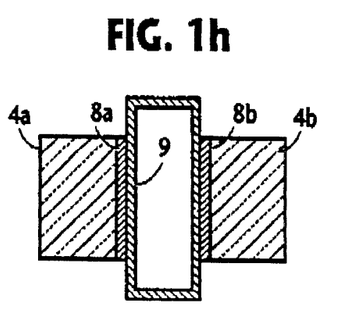
Figure 1I:
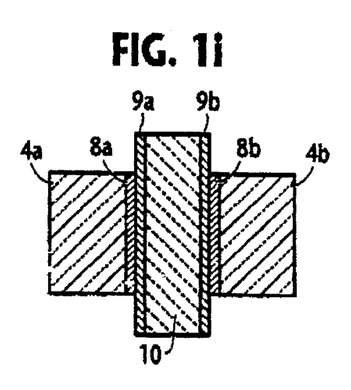
Figure 1J:
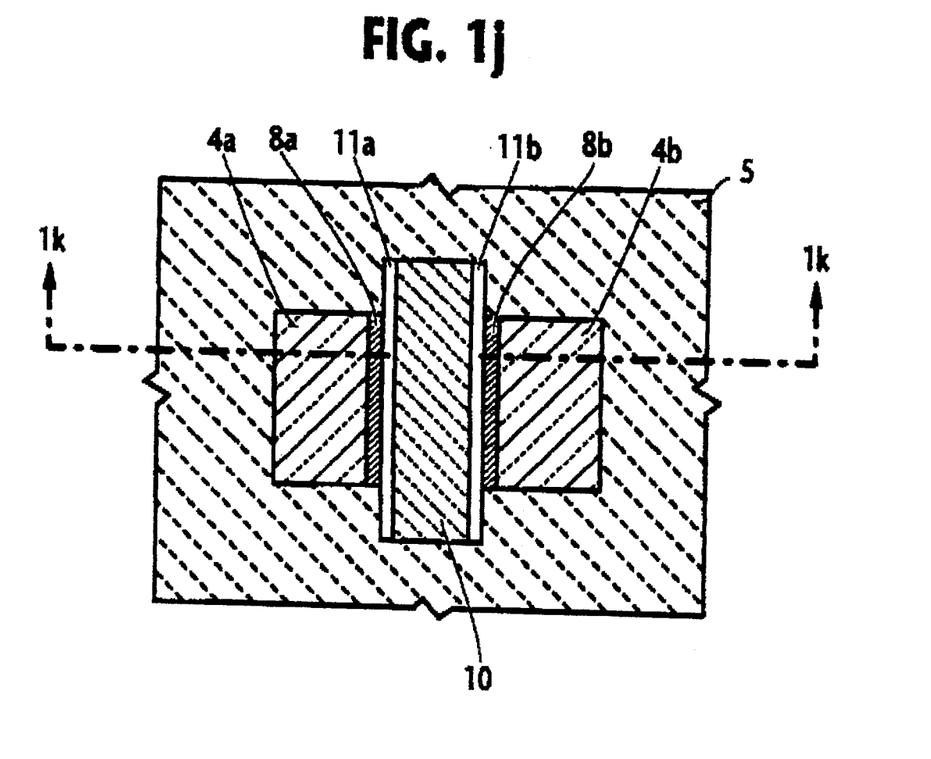
Figure 1K:
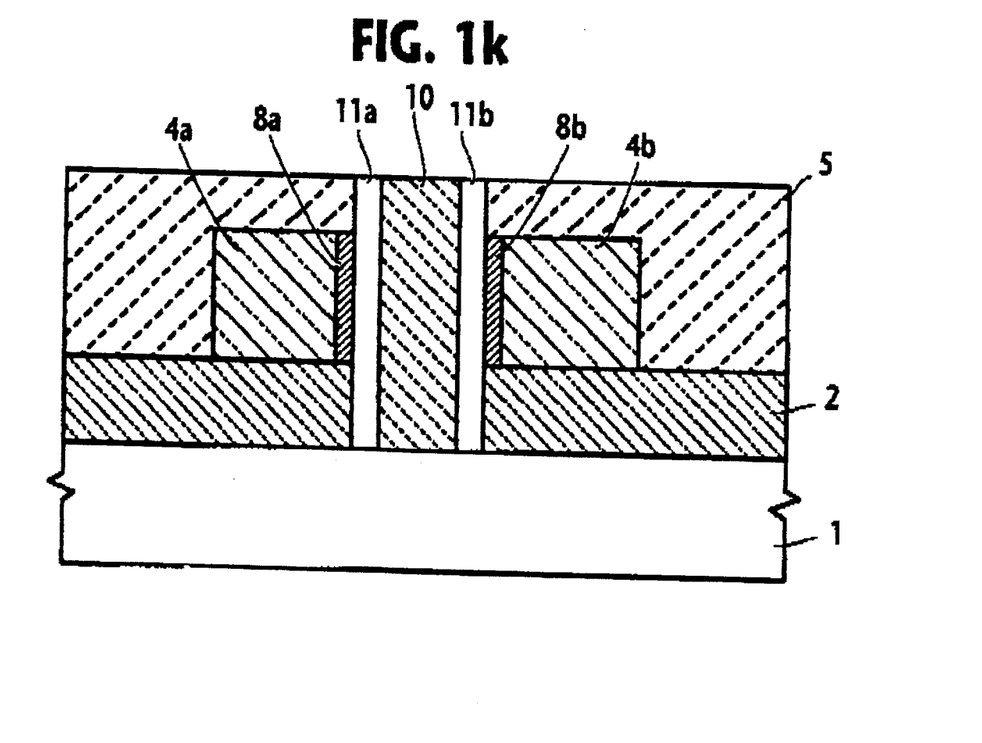
FIG. 1k is a cross-sectional view taken along the lines 1k—1k of FIG. 1j.
Figure 1L:
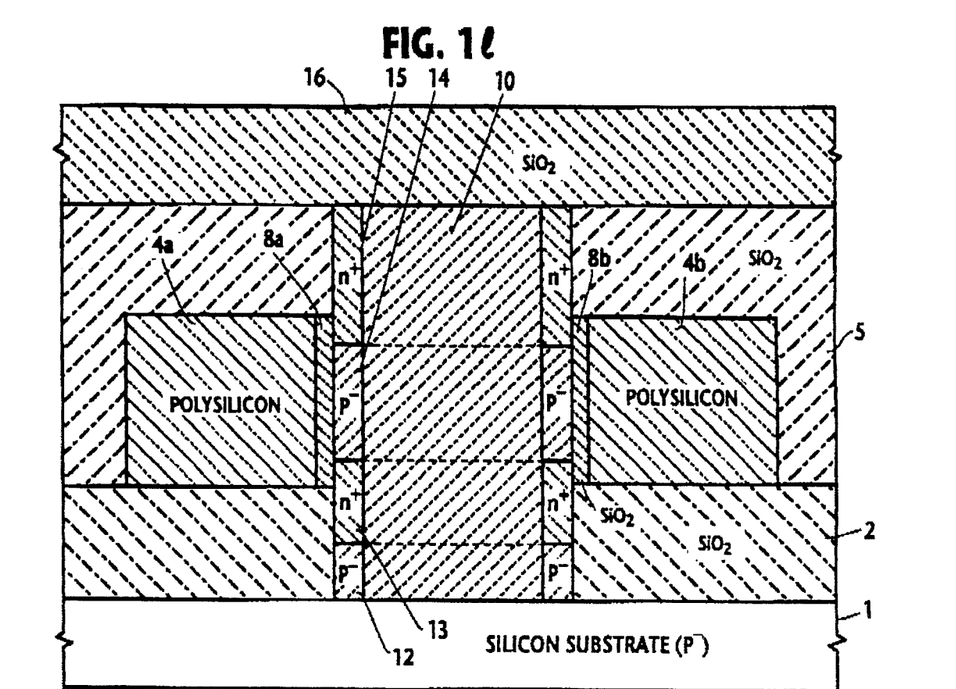
Figure 1M:
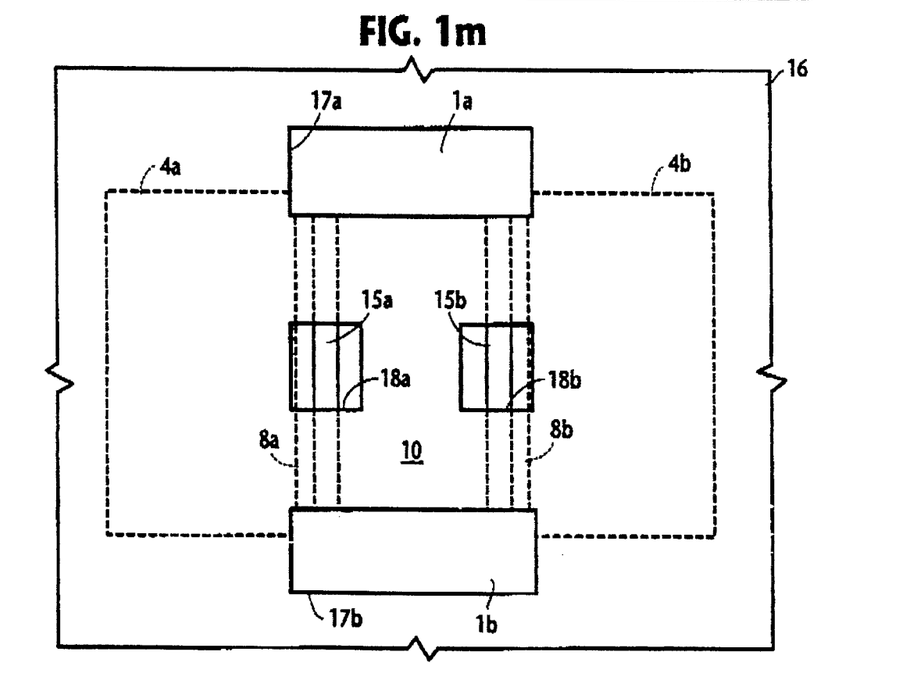
Figure 1N:
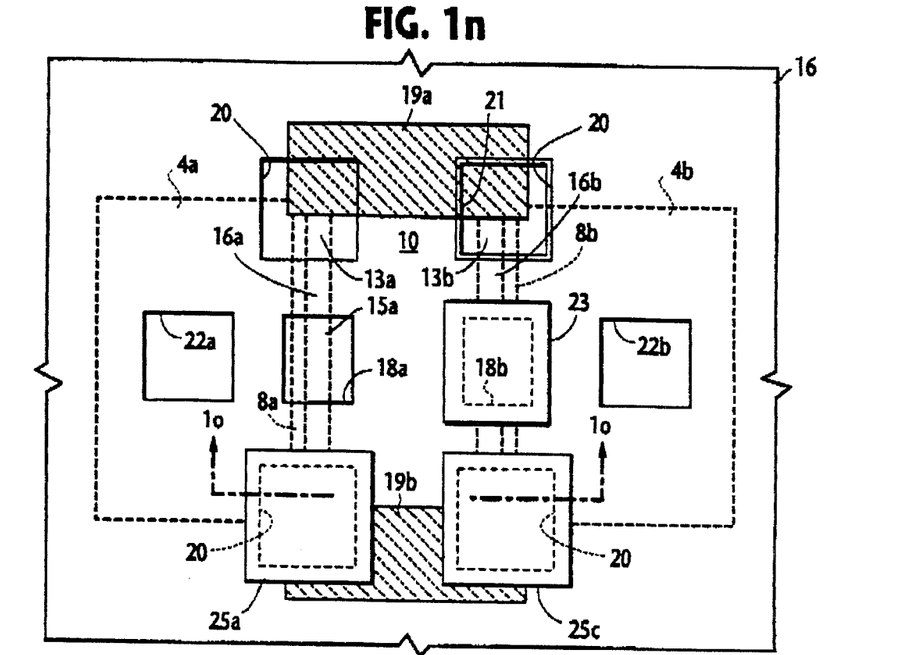
Figure 1O:
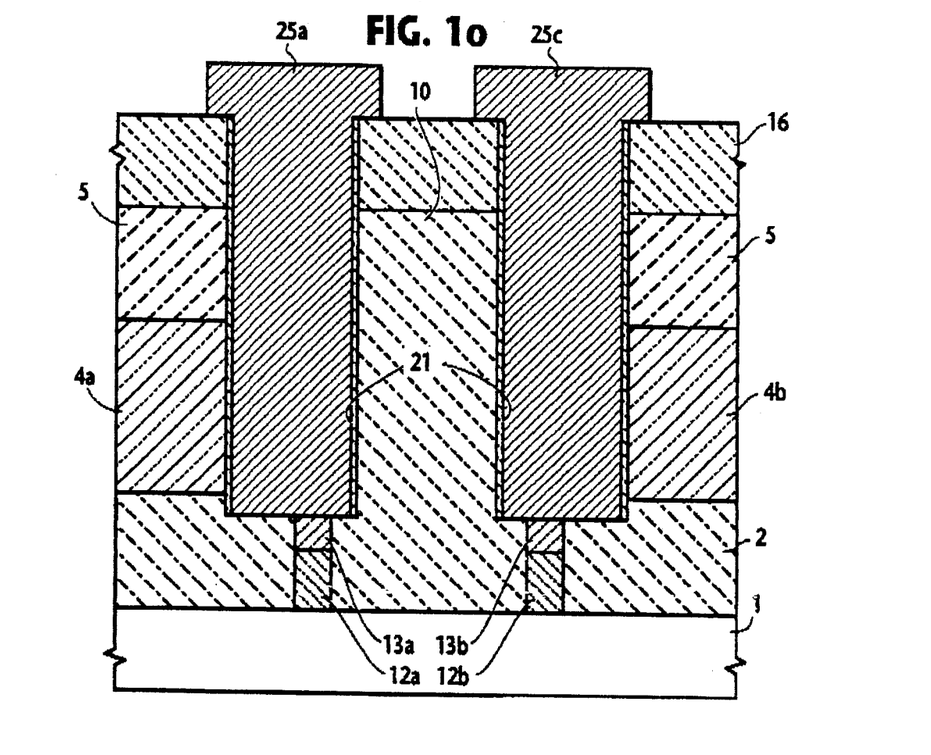
FIG. 1o is a cross-sectional view taken along the lines 1o—1o of FIG. 1n.
Figure 1P:
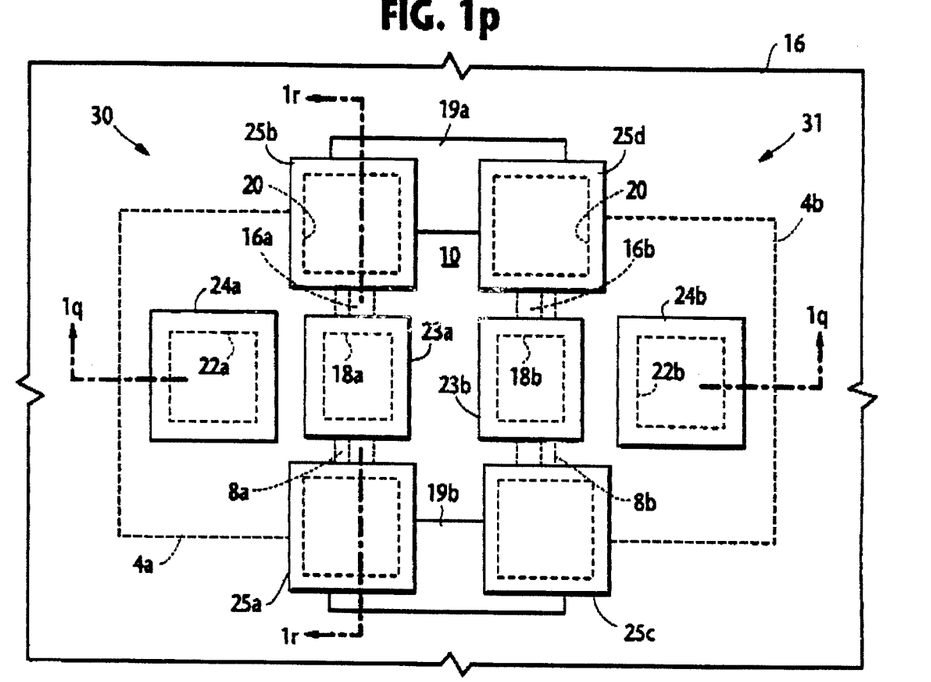
Figure 1Q:
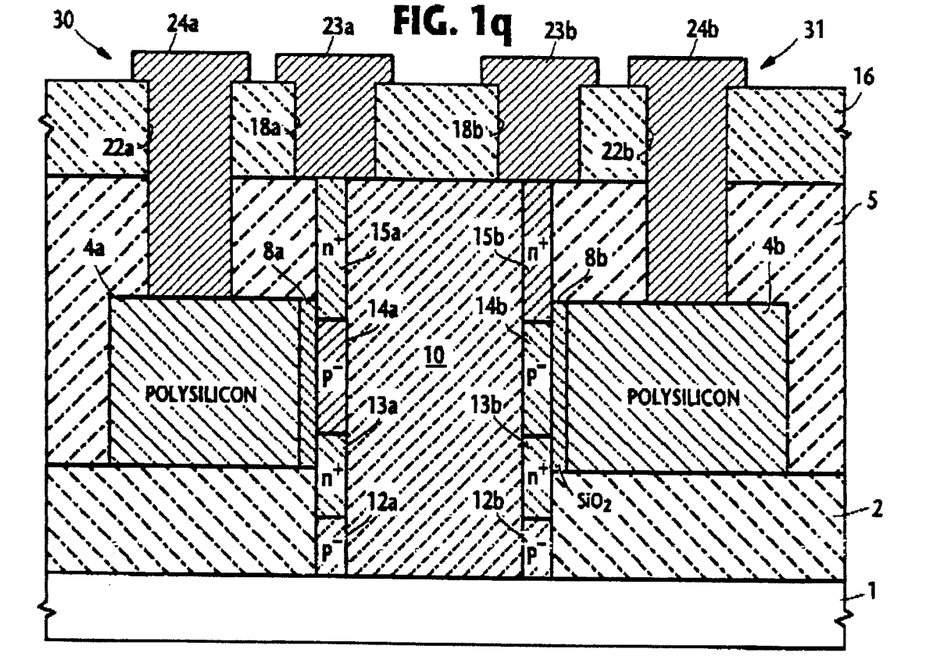
FIG. 1q is a cross-sectional view taken along the lines 1q—1q of FIG. 1p.
Figure 1R:
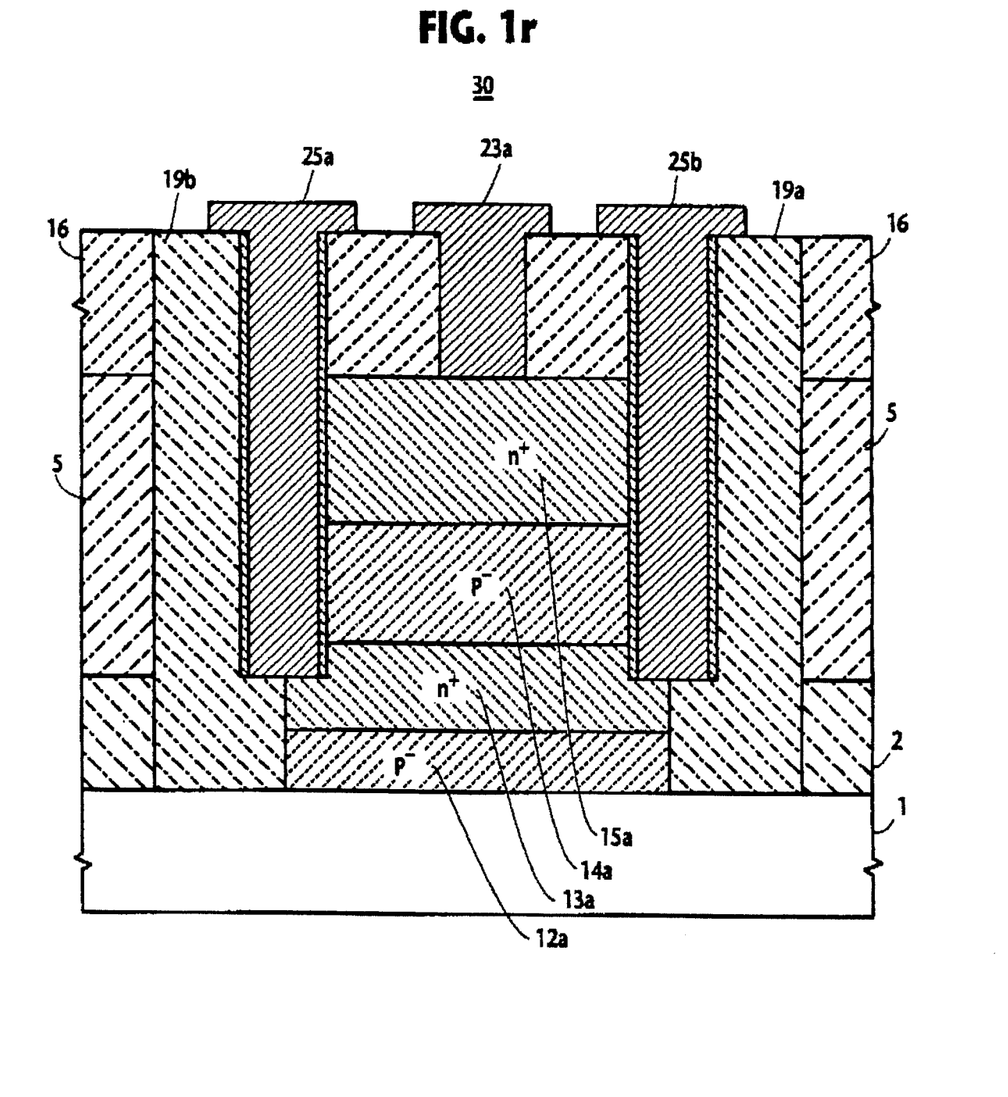
FIG. 1r is a cross-sectional view taken along the lines 1r—1r of FIG. 1p.

Referring now to FIGS. 1a to 1r, steps of fabricating a pair of metal-oxide semiconductor (MOS) field-effect transistors on an integrated circuit chip according to a first embodiment of the present invention are shown. A p-type silicon substrate 1 is heated to form a layer 2 of silicon dioxide thereon to a thickness of 2000 Å (FIG. 1a). A polysilicon layer 3 is then deposited on the $SiO_2$ layer 2 until it attains a thickness of 3000 Å using a low-pressure CVD (chemical vapor deposition) technique (FIG. 1b). Polysilicon layer 3 is then etched (FIG. 1c) to form a polysilicon island 4 and a silicon dioxide layer 5 is deposited using an ECR (electron cyclotron resonance) CVD technique to a thickness of 5000 Å from the surface of silicon dioxide layer 2 so that the polysilicon island 4 is buried under a 2000-Å, thick layer of silicon dioxide so that the upper surface of the chip is made smooth as possible (FIG. 1d).

A rectangular trench 6 is then created to expose a portion of the substrate 1 and produce equal polysilicon areas 4a and 4b as shown in FIGS. 1e and 1f. The smaller and longer sides of the trench 6 are 5000 Å and 1.0 μm, respectively. Using an isotropic etching technique, the opposed walls of the polysilicon areas 4a and 4b are etched to a depth of 50 Å. Silicon dioxide films 8a and 8b are respectively formed on the etched walls of the polysilicon areas 4a and 4b by thermal oxidation as shown in FIG. 1g. Polysilicon is then deposited to a thickness of 1000 Å on the side and end walls of the trench 6 as shown at 9 in FIG. 1h, followed by a reactive ion etching technique by which the polysilicon on the end walls of trench 6 are removed, leaving polysilicon films 9a and 9b on the side walls (FIG. 1i). Using low-pressure CVD technique, the trench 6 is refilled with silicon dioxide as shown at 10. Polysilicon films 9a and 9b are then removed to create parallel slits 11a and 11b (FIGS. 1j, 1k).

Using a selective epitaxial growth technique (a technique that does not allow silicon to grow on the surface of silicon dioxide), a stack of epitaxially grown silicon layers 12, 13, 14 and 15 of different conductivity types is formed within the slit 11. As shown in FIG. 1l, the first layer 12 has a thickness of 1000-Å and a conductivity type ($p^-$) same as that of the substrate. This layer is created by doping boron into the substrate through the slit 11 with a concentration of $3 \times 10^{17}$ $cm^{-3}$. The second epitaxial layer 13 has a conductivity type ($n^+$) opposite to that of the underlying silicon layer 12 and a thickness of 1500 Å. This layer is created by doping arsenide with a concentration of $1 \times 10^{19}$ $cm^{-3}$. The third layer 14 has the same conductivity type ($p^-$) as that of the first layer 12 and a thickness of 2000 Å, this layer being created by doping boron with a concentration of $5 \times 10^{17}$ $cm^3$. Alternatively, the intermediate $p^-$-type layer 14 may be formed of an intrinsic layer. The top layer 15 has a thickness of 2500 Å and a conductivity type ($n^+$) opposite to that of the underlying layer 14, this layer being created by doping arsenide with a concentration of $1 \times 10^{19}$ $cm^{-3}$. A silicon dioxide film 16 is then deposited on top of the chip to a thickness of 3000 Å, using the low-pressure CVD method.

Using photolithography and dry etching techniques, rectangular trenches 17a and 17b are produced so that portions 1a and 1b of the p-type silicon substrate 1 are exposed as shown in FIG. 1m and the epitaxial layers 12–15 and the silicon dioxide layer 16 are divided to form a first stack of epitaxial layers 12a–15a on one side of the refill 10 and a second stack of epitaxial layers 12b–15b on the other side of the refill 10. To provide source electrodes one for each of two identical transistors to be integrated into the circuit chip, portions of silicon dioxide layer 16 are then etched to create rectangular contact holes 18a and 18b that extend to a depth where portions of the top epitaxial layers 15a and 15b are exposed (FIG. 1m).

Trenches 17a and 17b are refilled with silicon dioxide as respectively shown at 19a and 19b in FIG. 1n. To provide drain electrodes for the transistors, four contact holes 20 are created to a depth where opposite end portions of the second epitaxial films 13a and 13b are exposed as clearly shown in FIG. 1n. A silicon dioxide layer 21 is then formed on the inside walls of the four drain contact holes 20. Portions of silicon oxide layer 16 are etched to create gate contact holes 22a and 22b to a depth where polysilicon areas 4a and 4b are exposed as shown in FIGS. 1q and 1r.

As shown in FIG. 1p, aluminum is then deposited into the source contact holes 18a and 18b to form a source electrode 23a for a transistor 30 and a source electrode 23b for a transistor 31, into the gate contact holes 22a, 22b to form a gate electrode 24a for transistor 30 and a gate electrode 24b for transistor 31, and into the drain contact holes 20 forming a pair of drain electrodes 25a, 25b for transistor 30 and another pair of drain electrodes 25c, 25d for transistor 31. Because of the low resistivity of polysilicon region 4a, gate electrode 24a is brought into a charge transfer relationship with the p⁻ channel 14a of transistor 30 via an insulator formed by the silicon dioxide film 8a (see FIG. 1q). Likewise, gate electrode 24b is brought into a charge transfer relationship with the p⁻ channel 14b of transistor 31 via the silicon dioxide film 8b.

A cross-section of transistor 30 is shown in FIG. 1r as comprising the source electrode 23a contacting the upper n⁺ layer 15a at the center thereof, and the drain electrodes 25a and 25b which contact the lower n⁺ layer 13a at the opposite ends thereof. Drain electrodes 25 of each transistor may be suitably connected together on the surface of the chip by a single metal contact, or connected by respective leads, not shown, to an external circuit where they are coupled together.

Figure 2A:
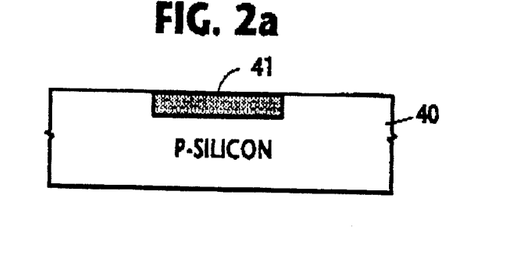
Figure 2B:
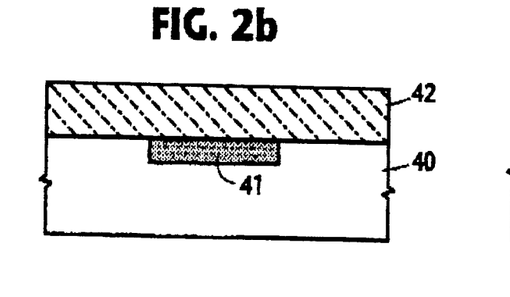
Figure 2C:
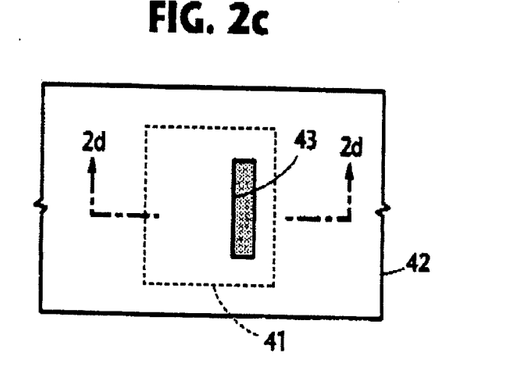
Figure 2D:
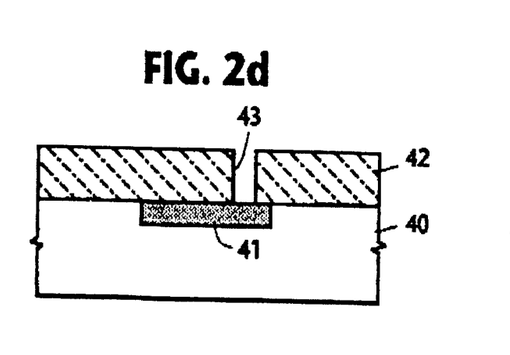
FIG. 2d is a cross-sectional view taken along the lines 2d—2d of FIG. 2c.
Figure 2E:
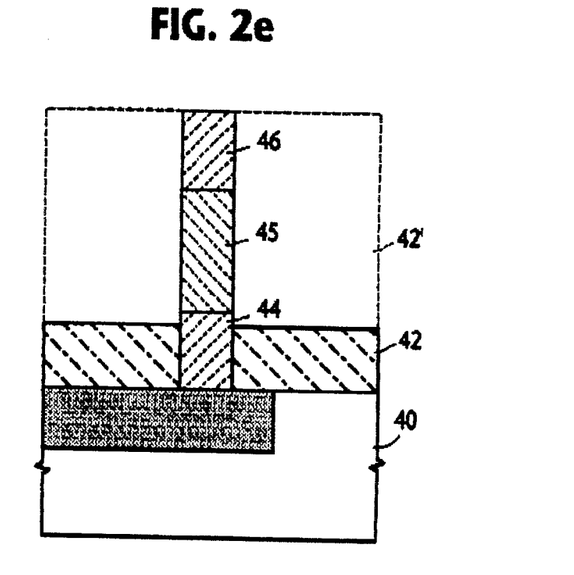
Figure 2F:
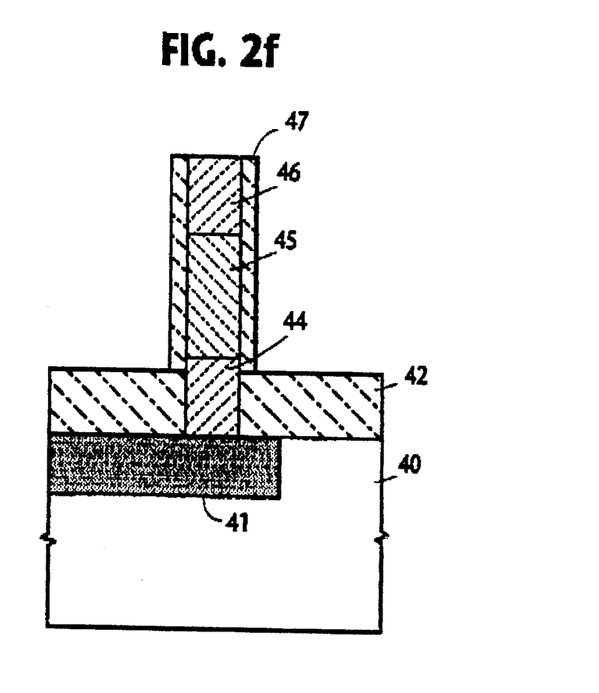
Figure 2G:
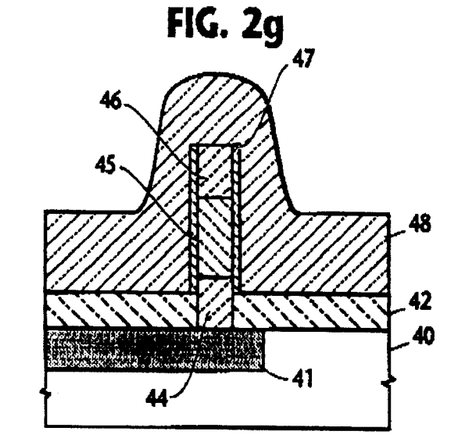
Figure 2H:
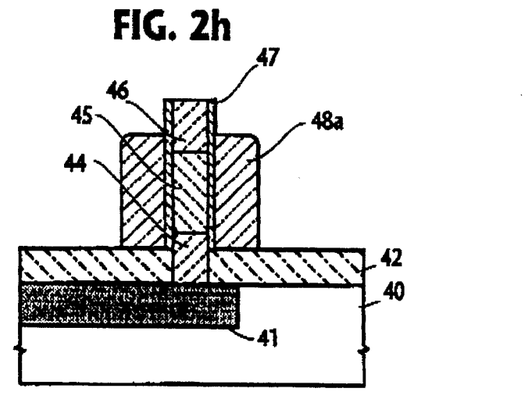
Figure 2I:
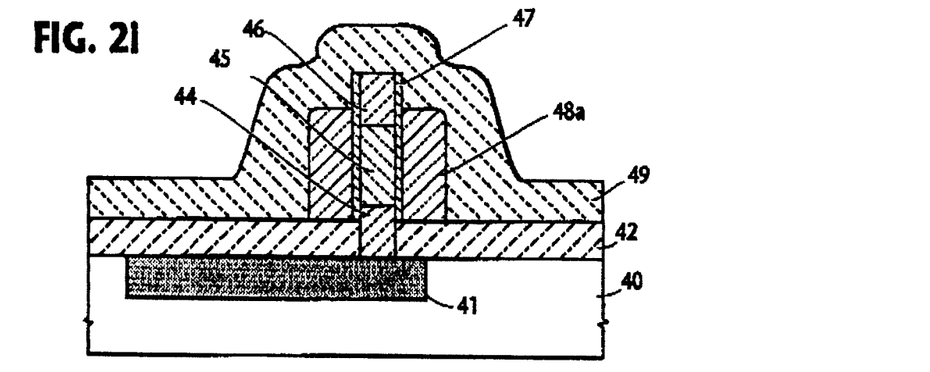
Figure 2J:
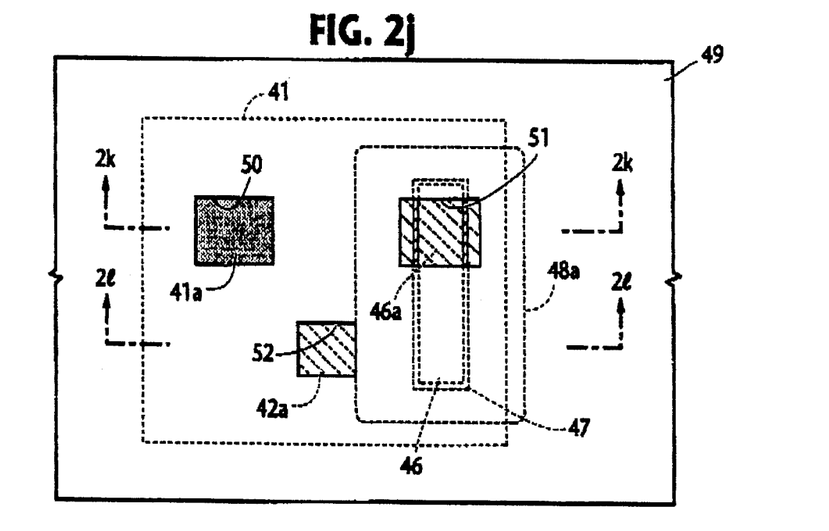
FIG. 2j is a cross-sectional view taken along the lines 2j—2j of FIG. 2i.
Figure 2K:
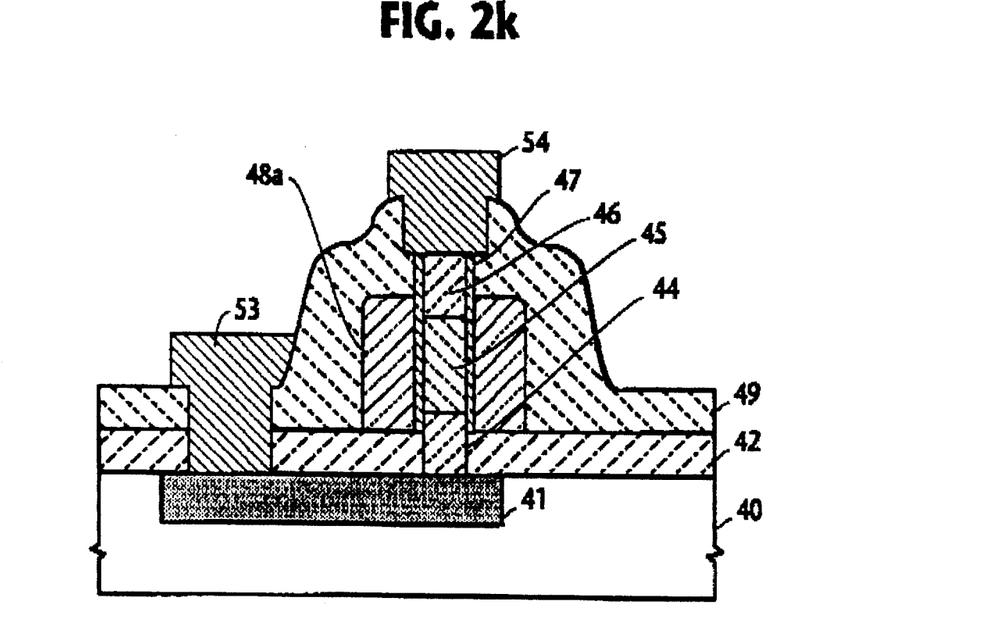
FIG. 2k is a cross-sectional view taken along the lines 2k—2k.
Figure 2L:
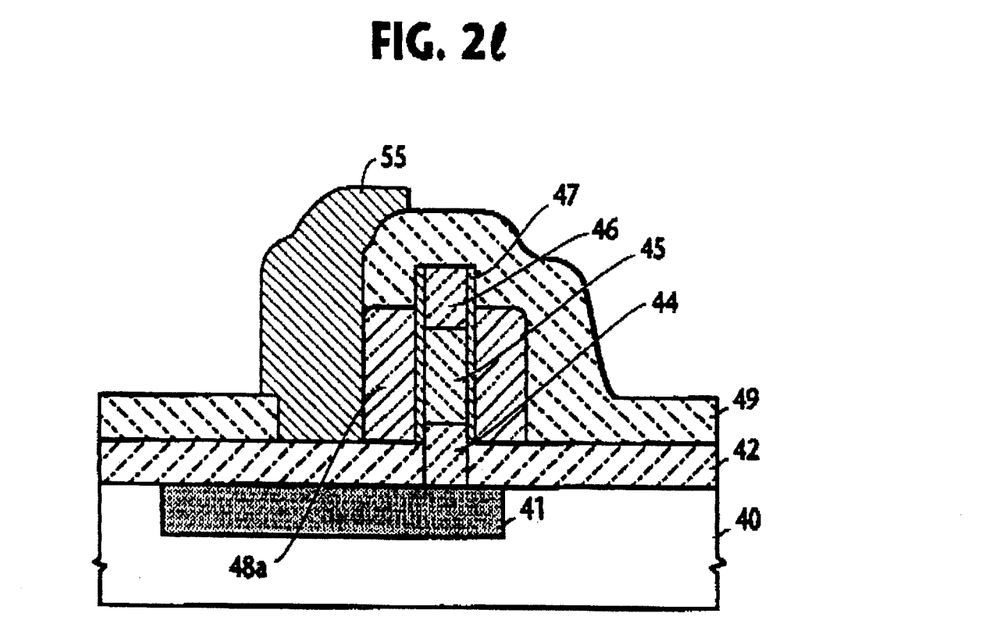
FIG. 2l is a cross-sectional view taken along the lines 2l—2l of FIG. 2j.

A second embodiment of this invention will now be described with reference to FIGS. 2a through 2l. A p-type silicon substrate 40 is ion-implanted to form a high concentration diffused region 41 of n-type conductivity on the surface of the substrate (FIG. 2a). A layer 42 of silicon dioxide is CVD-deposited on the substrate to a thickness of 5000 Å, (FIG. 2b). The silicon dioxide layer 42 is then etched to create a slit 43 so that a portion of the n-type diffused region 41 is exposed to the outside as shown in FIGS. 2c and 2d. Using a selective epitaxial growth technique, an n-type 1500-Å, thick silicon layer 44, a p-type 2000-Å, thick silicon layer 45 and an n-type 1500-Å thick silicon layer 46 are successively formed in the slit 43 and the silicon dioxide layer 42 is dry-etched to a depth of 4000 Å, as indicated at 42' in FIG. 2e, leaving the epitaxial layers 44, 45 and 46. By thermal oxidation a 100-Å, thick silicon dioxide film 47 is deposited on the side and end walls of the stacked epitaxial layers (FIG. 2f). A polysilicon layer 48 is then deposited over the chip to a thickness of 3000 Å as shown in FIG. 2g and then dry-etched by the same amount in order to leave a polysilicon region 48a that surrounds the insulated epitaxial layers (FIG. 2h). Using a CVD technique, a silicon dioxide layer 49 is then deposited on the chip to a thickness of 1000 Å as shown in FIG. 2i. As shown in FIG. 2j, contact holes 50, 51 and 52 are created so that a portion 41a of diffused region 41, a portion 46a of the top epitaxial layer 46 and a portion 42a of silicon dioxide layer 42 as well as a side wall of polysilicon region 48a are exposed to the outside. As indicated in FIGS. 2k and 2l, aluminum is then deposited into the contact holes 50, 51 and 52 to form a source electrode 53, a drain electrode 54 and a gate electrode 55.

Figure 3A:
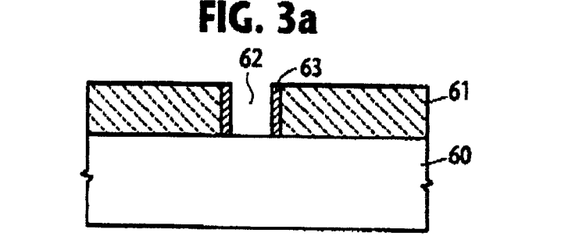
Figure 3B:
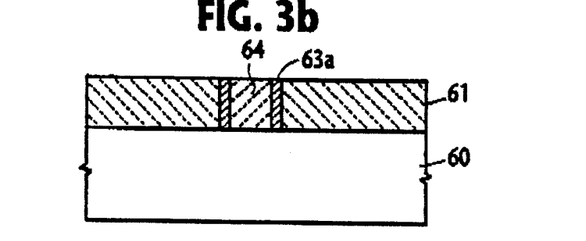
Figure 3C:
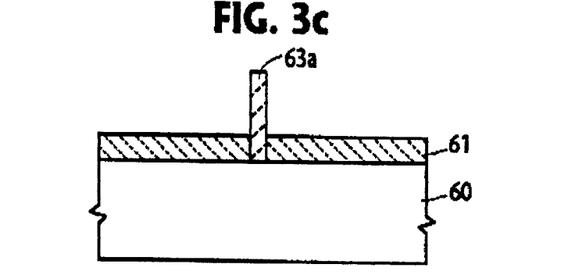
Figure 3D:
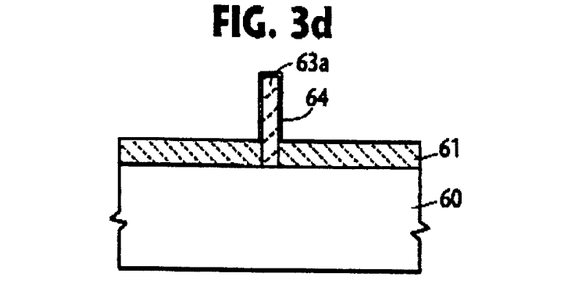
Figure 3E:
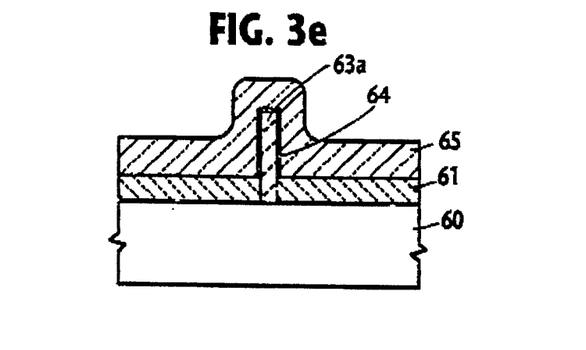
Figure 3F:
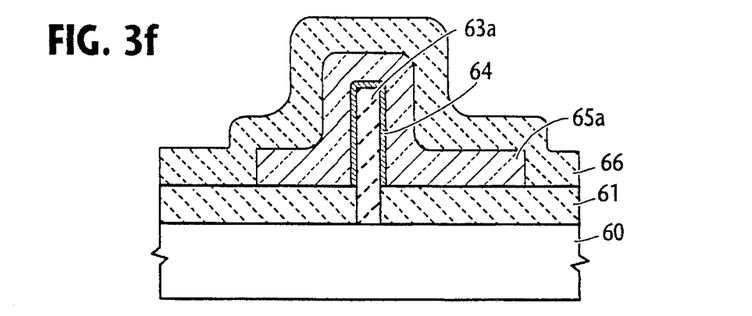
Figure 3G:
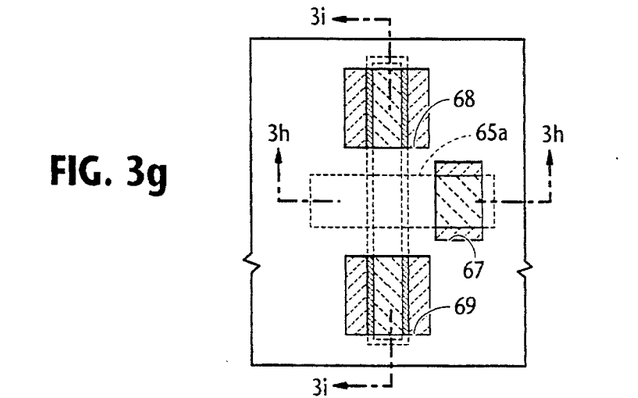

A third embodiment of this invention are shown in FIGS. 3a through 3i. On a p-type silicon substrate 60 is deposited by thermal oxidation a silicon dioxide layer 61 which is subsequently etched to form a slit 62 so that a portion of the substrate is exposed to the outside. A polysilicon layer 63 is then formed on the side and end walls of the slit 62 using low-pressure CVD and dry etching techniques. Silicon dioxide is deposited into the slit using the low-pressure CVD technique as shown at 64. Laser annealing is performed on the polysilicon film 63 so that it grows in a solid phase epitaxy mode using the substrate as a seed material and eventually changes to a single crystalline structure 63a (FIG. 3b). The chip is then patterned using a dry-etching technique to reduce the height of the silicon dioxide layer 61 and leave a portion of the single-crystalline silicon film 63a embedded in the reduced layer 61 as shown in FIG. 3c. Using an ion implantation method, the single crystalline silicon structure 63a is doped with a p-type impurity by subjecting it to obliquely injected ions. A 200-Å, thick silicon dioxide layer 64 is formed over the surface of the upstanding p-type single-crystalline silicon structure 63a by subjecting it to thermal oxidation (FIG. 3d). A polysilicon layer 65 is deposited over the chip (FIG. 3e) and then a dry-etching technique is used to pattern the polysilicon layer 65 so that it changes to a shape as indicated at 65a for covering a center portion of the side and top walls of the insulated single crystalline structure 63a (FIGS. 3f and 3g). N-type impurity is then doped into opposite end portions of the single Crystalline silicon structure 63a by obliquely injecting ions using the ion implantation technique.

Figure 3H:
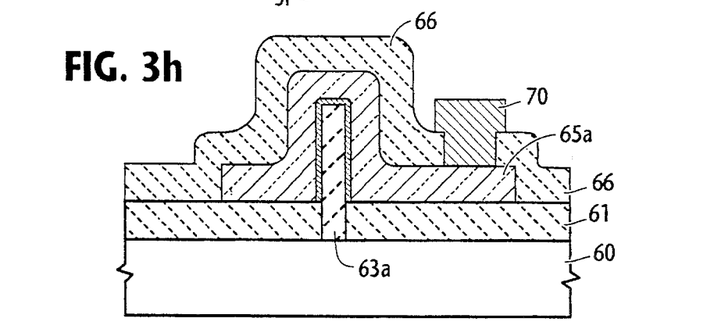
FIG. 3h and 3i are cross-sectional views respectively taken along the lines 3h—3h and 3i—3i of FIG. 3g.
Figure 3I:
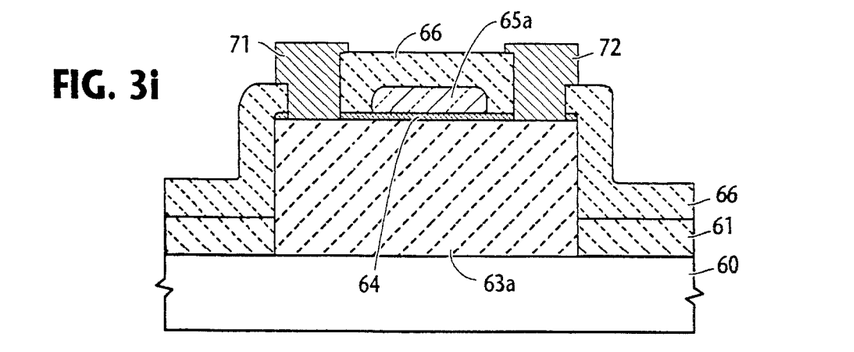

The chip is then buried under a silicon dioxide layer 66 (FIG. 3f) using a CVD technique, followed by a reactive ion etching method whereby contact holes 67, 68 and 69 are formed so that a portion of polysilicon layer 65a is exposed to the outside through hole 67, and opposite end portions of p-type single-crystalline structure 64 are exposed to the outside through contact holes 68 and 69, respectively (see FIG. 3g). As shown in FIGS. 3h and 3i, aluminum is deposited into the contact holes to form a gate electrode 70 and source and drain electrodes 71 and 72.

Figure 4A:
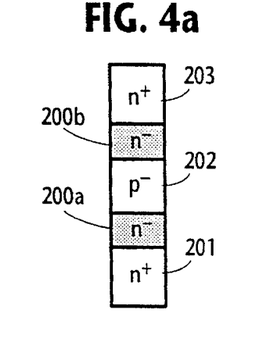
FIGS. 4a and 4b are cross-sectional views showing epitaxial layers according to modified embodiments of the present invention.
Figure 4B:
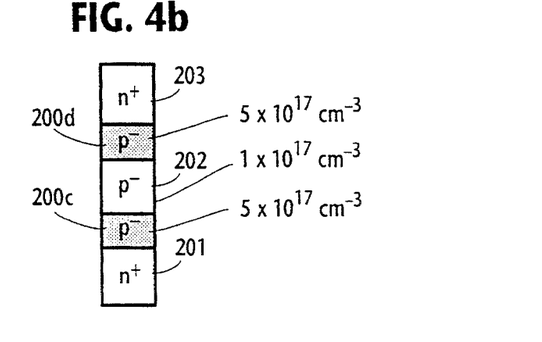

One advantage of the stacked epitaxial layers is that impurity concentration profile of epitaxial layers can be easily controlled. Another feature of the present invention is that, because of the ease with which the epitaxial layers are formed, an n-type, low concentration layer or a p-type high concentration layer can be interposed between successive epitaxial layers. As specifically shown in FIG. 4a, an n⁻-type, low concentration layer 200a is epitaxially grown between n⁺ and p⁻ type layers 201 and 202 and an n⁻-type, low concentration layer 200b is epitaxially grown between p⁻ and n⁺ type layers 202 and 203. Alternatively, a p⁻-type, layer 200c with a concentration of 5×10¹⁷ cm⁻³ is epitaxially grown between layers 201 and 202 and a p⁻-type layer 200d of the same concentration as layer 200c is epitaxially grown between layers 202 and 203 as shown in FIG. 4b.

Figure 5A:
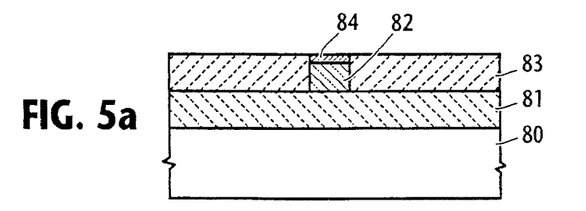
Figure 5B:
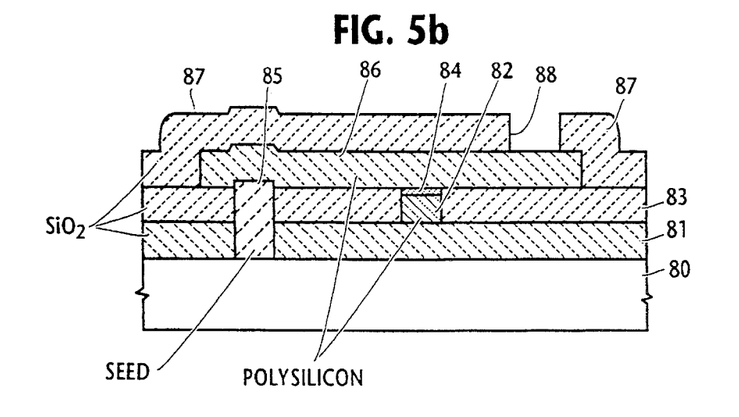
Figure 5C:
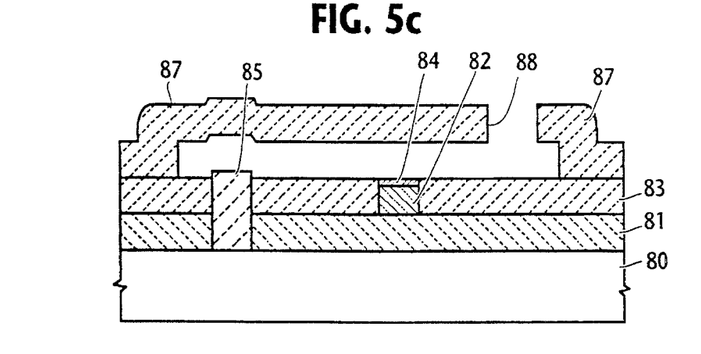

A fourth embodiment of the present invention is shown in FIGS. 5a through 5g. A silicon substrate 80 is subjected to thermal oxidation to form a 2000-Å, thick silicon dioxide layer 81. Polysilicon is deposited on the chip to a thickness of 3000 Å, and boron is doped thereinto by ion implantation technique so that the deposited polysilicon acquires a p⁺ conductivity, and is patterned using a photolithography and a reactive ion etching technique to form a p⁺ type polysilicon region 82 on the silicon dioxide layer 81. Silicon dioxide is then deposited to a thickness of 3000 Å and the surface of the deposited silicon dioxide is flattened to expose the polysilicon region 82, forming a silicon dioxide layer 83. Thermal oxidation is performed to form a 100-Å thick silicon dioxide layer 84 on the polysilicon region 82 (see FIG. 5a). An opening is created through layers 83 and 81 to the substrate using a photolithography and a reactive ion etching technique and a region 85 of silicon is grown in the opening using a selective epitaxial growth method (FIG. 5b). Polysilicon is then deposited on the chip to a thickness of 500 Å and patterned to form a layer 86. A 2000-Å thick silicon dioxide layer 87 is deposited on the chip and an opening 88 is created therein so that a portion of the polysilicon layer 86 is exposed to the outside. Using chlorine gas an isotropic etching process is performed to remove the polysilicon layer 86 by purging it through opening 88 (FIG. 5c).

Figure 5D:
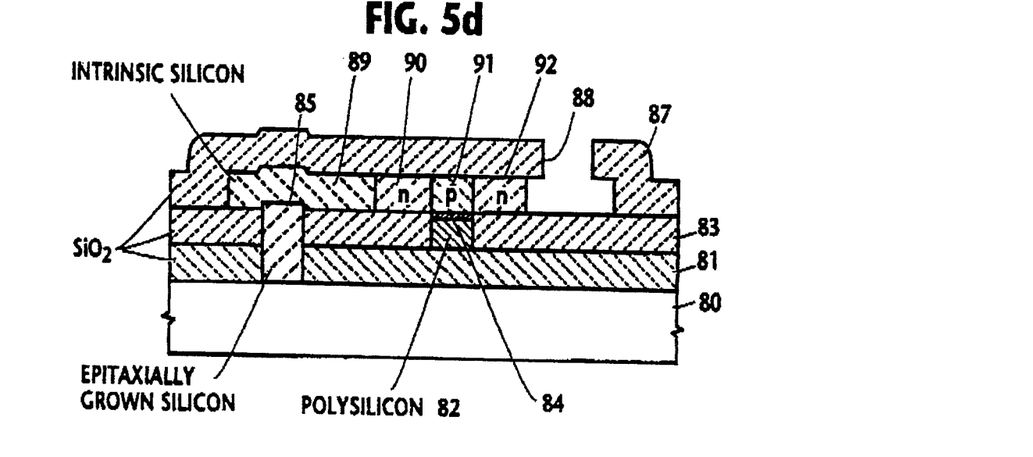

The epitaxially grown region 85 is then used as a seed for the epitaxial growth of a crystalline silicon structure in the space now left vacant by the removal of the polysilicon 86. During this process, an intrinsic silicon structure 89 is grown in a region immediately above the seed material 85. This is done by not doping impurities while the structure is being grown. As shown in FIG. 5d, an n-type region 90, a p-type region 91 and an n-type region 92 are epitaxially grown in succession in a lateral direction in a region from the rightmost end of intrinsic silicon structure 85 to a point adjacent the opening 88 so that the p-type region 91 is located immediately above the silicon dioxide film 84. More specifically, each of the n-type regions 90 and 92 has an impurity concentration of $5 \times 10^{20}$ cm$^{-3}$, the p-type region 91 having a concentration of $1 \times 10^{17}$ cm$^{-3}$.

Figure 5E:
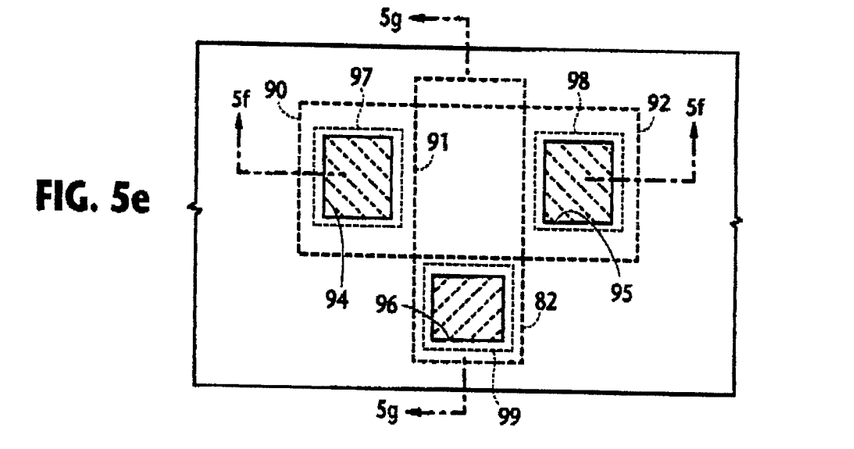
Figure 5F:
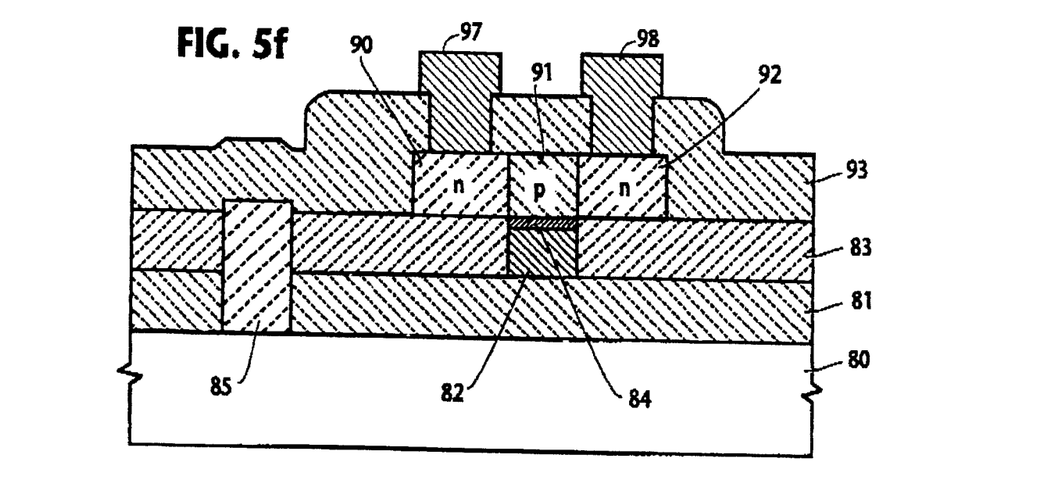
FIGS. 5f and 5g are cross-sectional views taken along the lines 5f—5f and 5g—5g of FIG. 5e, respectively.
Figure 5G:
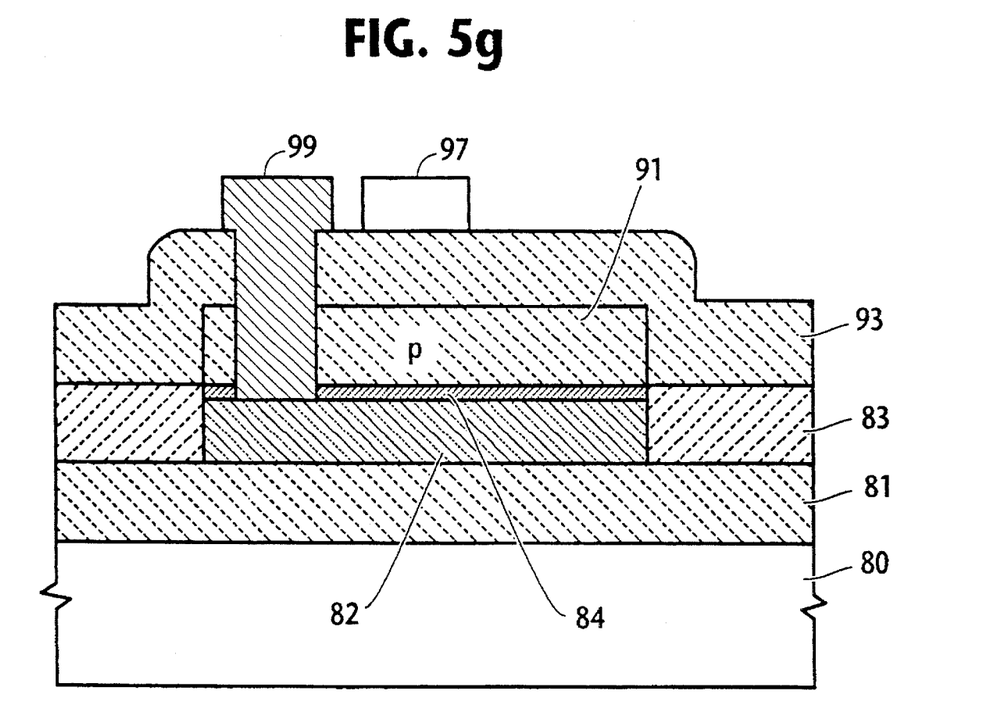

Reactive ion etching is then used to remove the silicon dioxide layer 87 to expose the epitaxially grown regions, followed by a patterning process by which the intrinsic region 89 is removed. Following this process, a silicon dioxide layer 93 is deposited over the chip (FIG. 5f). As shown in FIG. 5e, contact holes 94, 95 and 96 are produced by etching the silicon dioxide layer 93 so that a portion of the underlying n-type region 90 is exposed through contact hole 94, a portion of n-type contact region 92 is exposed through contact hole 95, and a portion of p-type region 91 is exposed through contact hole 96. Aluminum is deposited through the contact holes to create source and drain electrodes 97 and 98 and a gate electrode 99 as shown in FIG. 5g. While mention has been made of an integrated transistor structure in which the polysilicon region 82 is located below the p-type region 91, it could equally be as well located above the region 91 with an insulator in between.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A method of fabricating a transistor, comprising the steps of:

providing a substrate of a first conductivity type;

forming a first insulating layer on the substrate;

forming a conductive region on the first insulating layer;

forming a second insulating layer on the conductive region:

successively removing portions of the second insulating layer, said conductive region and said first insulating layer and forming an opening extending to the substrate, and forming a sidewall of the conductive region;

forming a sidewall insulator on the sidewall of the conductive region;

forming a region of easily removable material on a sidewall of said opening, said easily removable region being adjacent said first insulating layer, said sidewall insulator and said second insulating layer and leaving a portion of said opening exposed;

filling the exposed portion of said opening with an insulating material;

removing the easily removable region and forming a slit; and forming a semiconductor region within the opening, the semiconductor region having a first portion of a second conductivity the opposite to the first conductivity type, the first portion being adjacent the first insulating layer, the semiconductor region having a second portion of the first conductivity type, the second portion being adjacent the sidewall insulator and overlying the first portion, and the semiconductor region having a third portion of the second conductivity type, the third portion being adjacent the second insulating layer and overlying the second portion.

2. A method of fabricating a transistor, comprising the steps of:

providing a substrate of a first conductivity type;

forming a first insulating layer on the substrate;

forming a conductive region on the first insulating layer;

forming a second insulating layer on the conductive region;

successively removing portions of the second insulating layer, said conductive region and said first insulating layer and forming an opening extending to the substrate;

removing a sidewall portion of the conductive region and forming a recessed sidewall portion of the conductive region;

forming a sidewall insulator in said recessed portion of the conductive region;

forming a region of easily removable material on a sidewall of said opening, said easily removable region being adjacent said first insulating layer, said sidewall insulator and said second insulating layer and leaving a portion of said opening exposed;

filling the exposed portion of said opening with an insulating material;

removing the easily removable region and forming a slit; and forming a semiconductor region within the slit, the semiconductor region having a first portion of a second conductivity type opposite to the first conductivity type, the first portion being adjacent the first insulating layer, the semiconductor region having a second portion of the first conductivity type, the second portion being adjacent the sidewall insulator and overlying the first portion, and the semiconductor region having a third portion of the second conductivity type, the third portion being adjacent the second insulating layer and overlying the second portion.

3. A method as claimed in claim 1 or 2, wherein said first, second and third portions of the semiconductor region are formed by epitaxial growth.

4. A method as claimed in claim 1 or 2, further comprising the steps of:

forming first, second and third contact openings extending to said third portion of the semiconductor region, the conductive region and the first portion of the semiconductor region, respectively; and forming first, second and third electrical contacts in said first, second and third contact openings, respectively.

* * * * *